US009046788B2

(12) United States Patent
Gabor et al.

(10) Patent No.: US 9,046,788 B2
(45) Date of Patent: Jun. 2, 2015

(54) METHOD FOR MONITORING FOCUS ON AN INTEGRATED WAFER

(75) Inventors: Allen H. Gabor, Katonah, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 1420 days.

(21) Appl. No.: 12/122,929

(22) Filed: May 19, 2008

(65) Prior Publication Data
US 2009/0284722 A1 Nov. 19, 2009

(51) Int. Cl.
G03B 27/52 (2006.01)
G03B 27/68 (2006.01)
G03F 7/20 (2006.01)

(52) U.S. Cl.
CPC ........ *G03F 7/70333* (2013.01); *G03F 7/70508* (2013.01); *G03F 7/70641* (2013.01)

(58) Field of Classification Search
USPC ............................ 355/52, 53, 55, 77; 382/145
See application file for complete search history.

(56) References Cited

U.S. PATENT DOCUMENTS

| | | | |
|---|---|---|---|
| 5,049,925 A | 9/1991 | Aiton et al. | |
| 5,281,996 A | 1/1994 | Bruning et al. | |
| 5,300,786 A | 4/1994 | Brunner et al. | |
| 5,715,064 A | 2/1998 | Lin | |
| 5,742,067 A | 4/1998 | Imai | |
| 5,750,294 A | 5/1998 | Hasegawa et al. | |
| 5,866,437 A * | 2/1999 | Chen et al. | 438/14 |
| 6,046,792 A | 4/2000 | Van Der Werf et al. | |
| 6,081,614 A | 6/2000 | Yamada et al. | |
| 6,215,896 B1 | 4/2001 | Greig et al. | |
| 6,376,139 B1 * | 4/2002 | Fujisawa et al. | 430/30 |
| 6,509,952 B1 * | 1/2003 | Govil et al. | 355/52 |
| 6,618,118 B2 | 9/2003 | Minnaert et al. | |
| 6,782,525 B2 | 8/2004 | Garza et al. | |
| 6,803,995 B2 | 10/2004 | Ausschnitt | |
| 6,842,247 B1 | 1/2005 | Wehrens et al. | |
| 6,887,722 B2 | 5/2005 | Schedel et al. | |
| 6,949,319 B2 | 9/2005 | Watanabe | |
| 6,991,896 B2 * | 1/2006 | Kawashima | 430/394 |
| 7,110,099 B2 | 9/2006 | Littau et al. | |
| 7,218,379 B2 | 5/2007 | Osakabe et al. | |
| 7,732,103 B2 * | 6/2010 | Yao | 430/5 |
| 8,703,369 B2 * | 4/2014 | Spaziani et al. | 430/30 |
| 2005/0221238 A1 * | 10/2005 | Dierichs | 430/396 |
| 2006/0139610 A1 * | 6/2006 | Bruls et al. | 355/69 |
| 2006/0146310 A1 * | 7/2006 | De Kruif et al. | 355/69 |

(Continued)

*Primary Examiner* — Toan Ton
*Assistant Examiner* — Deoram Persaud
(74) *Attorney, Agent, or Firm* — DeLio, Peterson & Curcio, LLC; Kelly M. Nowak; Yuanmin Cai

(57) ABSTRACT

A method and apparatus are provided for improving the focusing of a substrate such as a wafer during the photolithography imaging procedure of a semiconductor manufacturing process. The invention is particularly useful for step-and-scan system and the CD of two features in each exposure field are measured in fields exposed at varying focus to form at least two Bossung curves. Exposure focus instructions are calculated based on the intersection point of the curves and the wafer is then scanned and imaged based on the calculated exposure focus instructions. In another aspect of the invention, when multiple wafers are being processed operational variances may cause a drift in the focus. The focus drift can be easily corrected by measuring the critical dimension of each of the features and comparing the difference to determine if any focus offset is needed to return the focus to the original calculated focus value.

21 Claims, 6 Drawing Sheets

(56) References Cited

U.S. PATENT DOCUMENTS

| | | | |
|---|---|---|---|
| 2006/0170899 A1* | 8/2006 | De Kruif et al. | 355/69 |
| 2006/0192936 A1* | 8/2006 | Schenau et al. | 355/69 |
| 2006/0234136 A1* | 10/2006 | Kim | 430/5 |
| 2007/0146668 A1* | 6/2007 | Geh et al. | 355/53 |
| 2007/0293973 A1* | 12/2007 | Kiers et al. | 700/121 |
| 2008/0044748 A1* | 2/2008 | Han et al. | 430/22 |
| 2008/0088812 A1* | 4/2008 | Magnusson | 355/55 |
| 2008/0153011 A1* | 6/2008 | Yamamoto | 430/5 |
| 2008/0192221 A1* | 8/2008 | Mieher et al. | 355/55 |
| 2008/0295060 A1* | 11/2008 | Lucas et al. | 716/19 |
| 2008/0304037 A1* | 12/2008 | Totzeck et al. | 355/71 |
| 2009/0135389 A1* | 5/2009 | Hofmans et al. | 355/55 |

* cited by examiner

GOOD LAYOUT

BAD LAYOUT

METHOD FOR MONITORING FOCUS ON AN INTEGRATED WAFER

BACKGROUND OF THE INVENTION

1. Field of the Invention

This invention relates to the manufacture of semiconductor substrates and, more particularly, to a method for determining the best focus during a photolithography imaging procedure and to a method for adjusting the focus value a wafer is exposed with by monitoring focus on an integrated wafer during the photolithography imaging procedure of the manufacturing process by calculating the amount of any focus drift away from a predetermined best focus and thus determining what correction to apply to return the process to best focus.

2. Description of Related Art

The manufacture of semiconductor substrates such as wafers and chips involve the use of high-resolution lithography systems. In such systems, the patterned mask (i.e., reticle) is illuminated with radiation (e.g., laser radiation or radiation from an arc lamp) that passes through the illumination system and achieves high-degree illumination uniformity over the illuminated portion of the mask. A portion of the radiation that passes through the mask is collected by a projection lens, which has an image field of a given size. The projection lens images the mask pattern onto an image-bearing substrate or workpiece such as a wafer. The workpiece resides on a workpiece stage that moves the workpiece relative to the projection lens so that the mask pattern is repeatedly formed on the workpiece over multiple "exposure fields." An "exposure field" is defined as the mask pattern which is formed on the wafer during the step-and-scan process of the mask pattern.

Lithography systems include an alignment system that precisely aligns the workpiece with respect to the projected image of the mask thereby allowing the mask to be exposed over a select region of the workpiece. Two types of lithography systems are typically used in manufacturing. One system is the step-and-repeat system, or "steppers" and the other is the step-and-scan system, or "scanner." With steppers, each exposure field on the workpiece is exposed with a single static exposure. With scanners, the workpiece is exposed by synchronously scanning the workpiece and the mask across the lens image field. An exemplary scanning lithography system and method is described in U.S. Pat. No. 5,281,996, which is incorporated herein by reference. The following description will be mainly directed to the step-and-scan system although it will be understood by those skilled in the art that the invention is applicable to any type imaging system.

As is well known, in a typical photolithographic process, a thin layer of a photosensitive material or photoresist is deposited over a semiconductor wafer. Each wafer typically has many chips thereon. During the photolithography process, illumination such as ultra-violet light is illuminated through a lens system and a photolithographic mask or reticle to a chip on the semiconductor wafer. The reticle has a particular device pattern and the pattern is exposed over a portion of the chip by the illumination to create exposed and unexposed regions on the chip. These exposed or unexposed regions are then washed away to define circuit elements on the chip. This photolithography process is repeated many times on different layers of the semiconductor processor, with intermediate processing steps, to define many circuit elements on the chips on the wafer.

Typically, a reticle is made from a transparent plate that has an opaque pattern on it which defines the pattern. The plate is often made of glass, quartz, or the like and the opaque region typically includes a layer of chrome. The device exposure region generally has a square or rectangular shape and is positioned in the center of the reticle. The device exposure region includes transparent portions and opaque portions defining a device pattern. The transparent portions in the device exposure region allow illumination from a light source to travel through them and reach the wafer. On the other hand, the opaque regions of the device region block the light and the light does not reach the wafer.

FIG. 5 shows a typical prior art reticle 80 having a square device region 82 surrounded by an opaque chrome region 84. For the sake of simplicity, a device pattern 88 in the device region is not illustrated in detail in the figure. There is a kerf region 86 at the periphery of the device region 82 between the device region 82 and opaque chrome region 84. The kerf region 86 typically contains structures used to align to prior levels and usually includes test structures to verify the performance of a photolithographic and/or other processes. For example, the kerf region may include alignment marks to allow for accurate reticle alignment and marks to measure the resolution of the device pattern during the photolithographic process.

Lithographic imaging is highly dependent on substrate uniformity. A lithographic process can tolerate a small range of topography variation through the "depth of focus" inherent in the process capability. However, unanticipated topography variation on the substrate is a known problem for lithography processes and can result in a faulty imaging process and a rejection of the imaged workpiece.

Modern exposure systems such as the step-and-scan exposure system utilize an optical leveling system to control the height (focus) of the scanning slit above the wafer. The exposure tool can adjust to fluctuations in step-height by a set of simple linear motions. The problem arises when major stepheight changes or differences in pattern density occur across the reticle field as shown in FIG. 2A. Region A has an isolated via 58 and region B has a dense via field 60. Even sophisticated leveling systems are faced with a conflict on where to place the imaging focal plane relative to the pattern density and, in general, trade-offs are made in some form of minimizing the average focus displacement across the imaging field.

Focus error is typically quantified as an offset error in the location of the wafer in the Z-axis relative to a perfectly focused image plane. This focus offset or defocus (measured, for example, in nanometers) has a positive or negative Z-axis displacement with respect to ideal focal plane, along with a magnitude representative of the distance by which surface is offset from the ideal focal plane. By determining the direction of misfocus (i.e., the positive or negative Z-axis translation of the wafer), along with a displacement value, accurate adjustment of wafer back to proper focus can be accomplished. For example, through manual or automated adjustment of the position controller controlling the X, Y, Z location of the wafer within the wafer scanner the wafer could be repositioned to reduce focus error so as to improve system resolution.

In operation, at each step, or field, the scanner performs a focusing operation, typically by moving the wafer in the z-direction to match the wafer surface with the optimum image plane of the optical system. To perform the focusing operation, certain focus data, specifically, the position of the wafer surface in the z-direction, is measured and the position of the wafer in the z-direction is servo-controlled to modify the detected focus shift amount.

To obtain best focus, the critical dimension (CD) is plotted as a function of focus. The difference in CD from one focus step to the next becomes less and less as the best focus is approached. Under ideal conditions, the best focus is the point at which variation in the CD between successive focus steps is at a minimum. In another expression of this method, a polynomial curve can be used to fit the CD to focus, and the best focus will be at a point where the slope of the polynomial curve is zero. Both "concave up" and "concave down" responses are possible, depending on the feature type, photoresist chemistry and processing, and therefore a minima or maxima of the polynomial curve is possible. In either case, the best focus is at the point where the slope of the polynomial curve is zero. Various other statistical techniques can be used to calculate the best focus.

One of the more widely used techniques for determination of best focus is the so-called "Bossung plot" method. When a CD metrology tool such as a CD-SEM or scatterometer measures CD of a selected feature printed through a range of focus, the resulting trend is usually polynomial. Fitting a polynomial curve to the CD trend and determining where the slope of the curve is zero identifies best focus. These curves are known as Bossung plots. One advantage to the Bossung method is that the actual CD of the process is quantified in addition to the best focus condition. However, the fact that this technique for determining best focus requires a wafer with varying focus to be printed and measured, prevents it from being used to monitor a tools focus drift on a lot to lot basis. Specifically, while the original determination of best focus determination is accurate for the specific wafer which it was determined on, a best focus determined by a wafer shot with varying focus steps the next day, or even later the same day, could be different due to exposure tool focus drift. However, the method requires a wafer be printed and measured with varying focus, which makes it a non-ideal method to determine best focus and difficult to implement in an automated manner. This is because of the cost associated with having to throw out chips that are printed not at best focus due to reliability concerns. Even if the wafers with varying focus were reworked there is still the cost of the exposure and metrology tool time.

U.S. Pat. No. 6,081,614 to Yamada et al. relates to a surface position detecting method applicable to a slit-scan type or scanning exposure type exposure apparatus, for continuously detecting the position or tilt of the surface of a wafer with respect to the direction of an optical axis of a projection optical system. As discussed therein, the focusing of a mask image in these apparatuses continuously performs corrective drive for auto-focusing and auto-leveling during the scanning exposure process. A level and surface positioning detecting mechanism uses an oblique projection optical system wherein light is projected to the surface of a wafer obliquely from above and wherein reflection light from the photosensitive substrate is detected as a positional deviation upon a sensor. From the measured values of level during the scan, a corrective drive amount is made to the level (height) and tilt of the wafer as the measurement position passes the exposure slit region. The disclosure of this patent is incorporated herein by reference.

The Yamada et al. patent improves the wafer positioning by measuring beforehand errors to be produced with respect to the level detection points due to a difference in pattern structure among the level detection points disposed along the scan direction. The measurement error with respect to each level detection point is then used to correct the position of the wafer using the surface position detecting system.

Thus, there still exists a need for a methodology to easily determine the best focus and to monitor focus during the lithography step in the manufacture of semiconductor wafers to ensure that each wafer is exposed with as close to best focus as possible.

As noted above, the subject patent application is applicable to any such leveling system.

SUMMARY OF THE INVENTION

Bearing in mind the problems and deficiencies of the prior art, it is therefore an object of the present invention to provide a method for making semiconductor wafers utilizing an improved method for determining the best focus to expose a wafer with and for monitoring focus of the wafer during the photolithographic process. The method is particularly suitable for the step-and-scan system.

It is another object of the present invention to provide an apparatus for making semiconductor wafers utilizing an improved apparatus for focusing the wafer and for monitoring focus of the wafer during the photolithographic process. A step-and-scan apparatus is preferred.

Still other objects and advantages of the invention will in part be obvious and will in part be apparent from the specification.

The above and other objects, which will be apparent to those skilled in art, are achieved in the present invention which is directed to, in a first aspect, a method of monitoring focus during photolithography on a wafer comprising the steps of:
 loading a wafer and a patterned reticle into a step-and-scan wafer imaging photolithography exposure system;
 exposing the reticle using the step-and-scan system at a first focus forming a first exposure field of the reticle pattern on the wafer;
 repeating the exposing step at a different focus for a next exposure field until a desired number of exposure fields are formed on the wafer, each repeating exposing step being performed at a different focus;
 measuring the critical dimension of a feature in two different regions in each exposure field, the features and regions being the same in each exposure field;
 plotting Bossung curves of critical dimension versus focus for the features in the two different regions;
 plotting the difference between the Bossung curves for the features in the two different regions;
 determining if the difference plot has sufficient sensitivity to be used as a focus monitor and, if not, choosing new features in two different regions and repeating the measuring and plotting steps until sufficient sensitivity for use as a focus monitor is achieved;
 determining focus instruction values based on the difference plot focus monitor;
 scanning and exposing a new wafer based on the determined focus instruction values.

In another aspect of the invention, the above method is used with the following steps to monitor the focus during use of the method to scan multiple wafers or lots further including:
 determining if the exposure system focus instruction value has drifted by exposing a new wafer to create exposure fields at a different focus based on the focus instruction values, again measuring critical dimension of a feature in two different regions in each exposure field to create new Bossung curves;
 plotting the difference between the new Bossung curves;
 determining if the difference between the new Bossung curves has changed compared to the difference between the previous Bossung curves; and adjusting if necessary the focus instruction values based on the difference between the new Bossung curves.

In another aspect of the invention an apparatus is provided for making an integrated circuit device such as a wafer wherein photolithography means are used to image the wafer during the making of the integrated circuit device comprising:

a loading apparatus for loading a wafer and a patterned reticle into a step-and-scan wafer imaging photolithography exposure system; the photolithography exposure system including an exposure apparatus to expose the reticle at a first focus forming a first exposure field reticle pattern on the wafer and repeating the exposure for a next exposure field at a different focus until all the desired reticle patterns are formed on the wafer, with each repeating step being performed at a different focus;

a measuring apparatus to measure the critical dimension of a feature in two different regions in each exposure field, the features and regions being the same in each exposure field;

a plotting apparatus to plot a Bossung curve of critical dimension versus focus for the features in the two different regions;

a plotting apparatus for plotting the difference between the critical dimension for the features in the two different regions;

a focus determination apparatus to determine a focus instruction value for the exposure fields based on the above plots;

a scanning and imaging apparatus for scanning and imaging the wafer based on the determined focus instruction value; and a release apparatus for releasing the wafer and unloading the wafer from the exposure system.

In a further aspect of the invention, the above apparatus when used to monitor the focus during use of the apparatus to scan multiple wafers or lots further comprises:

an exposing apparatus to expose a new wafer to create exposure fields at different focus based on the focus instruction values;

a measuring apparatus to measure the critical dimension for the features;

a calculating apparatus to calculate the difference between the critical dimension of a feature in each exposure field to create new Bossung curves;

a plotting apparatus to plot the difference between the new Bossung curves;

a determining apparatus to determine if the difference between the new Bossung curves has changed compared to the difference between the previous Bossung curves;

an adjusting apparatus to adjust the focus instruction value if necessary based on the difference;

a scanning and exposing apparatus to scan and expose the next wafer based on the adjusted focus instruction values: and continuing the above steps until the scanning and exposing of each wafer is completed.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-8 of the drawings in which like numerals refer to like features of the invention.

Broadly stated, the present invention allows best focus to be maintained in a feedback loop that is fast and economical, in the form focus correction based on measured CD differences between features, available to the leveling software of the photolithography exposure tools which controls the leveling of the wafer during the exposure process (and, hence, the focus of the wafer). By being aware of these data and exposure focus instructions, the product chip receives the best focus process conditions known based on recently exposed wafers. The method and apparatus provides for monitoring the desired focus by measuring and comparing critical dimension data to determine if any focus correction is needed to return to the original calculated desired focus value.

More specifically, the differences in focus caused by pattern density on a wafer may be detected by a pre-scanning method in the exposure tool using multiple Bossung plots formed from the exposure fields to calculate the best focus for the photolithography process.

Figure 3:
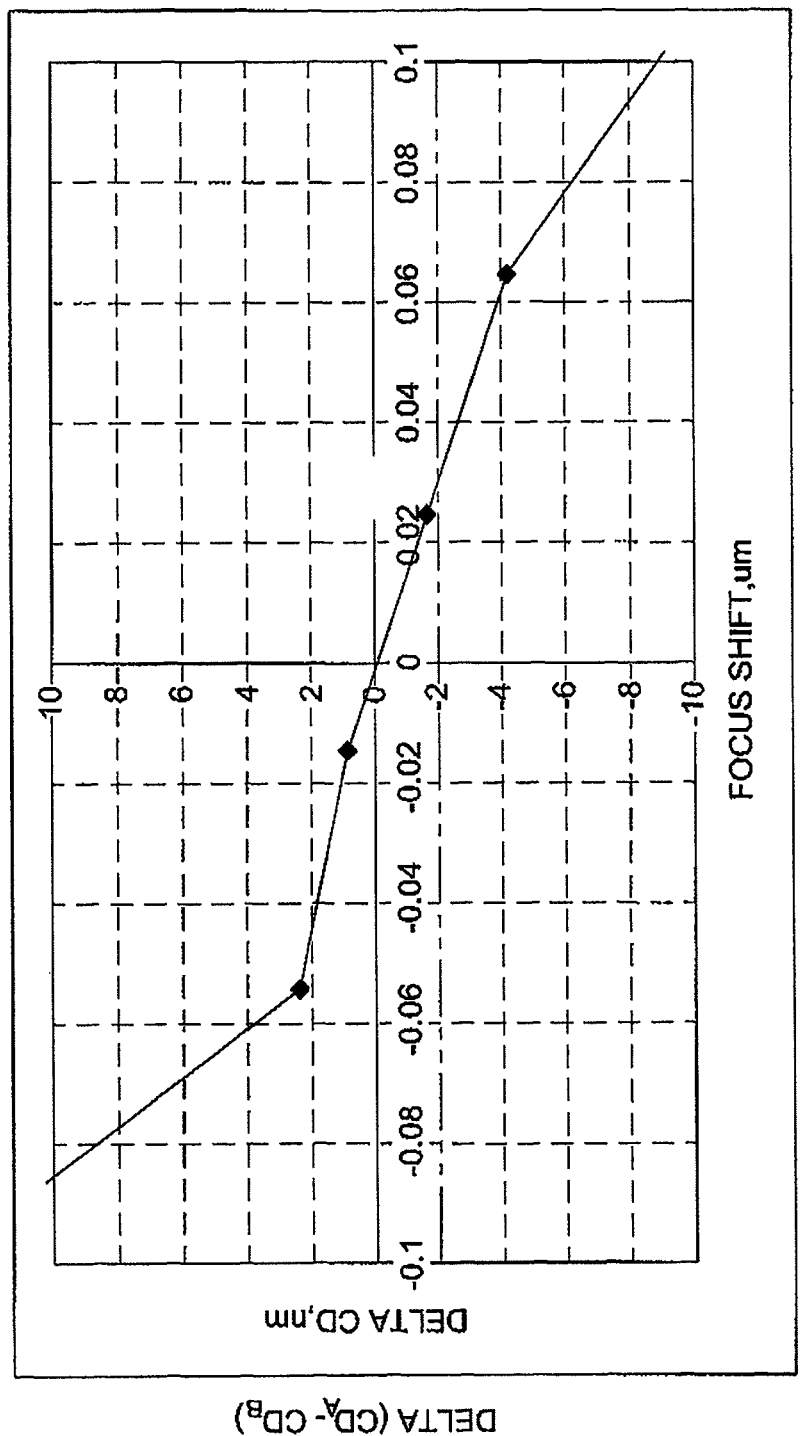
FIG. 3 is a plot showing the change in difference between the critical dimension of feature A and critical dimension of feature B versus focus shift which changes may be caused by operational variances.
Figure 6:
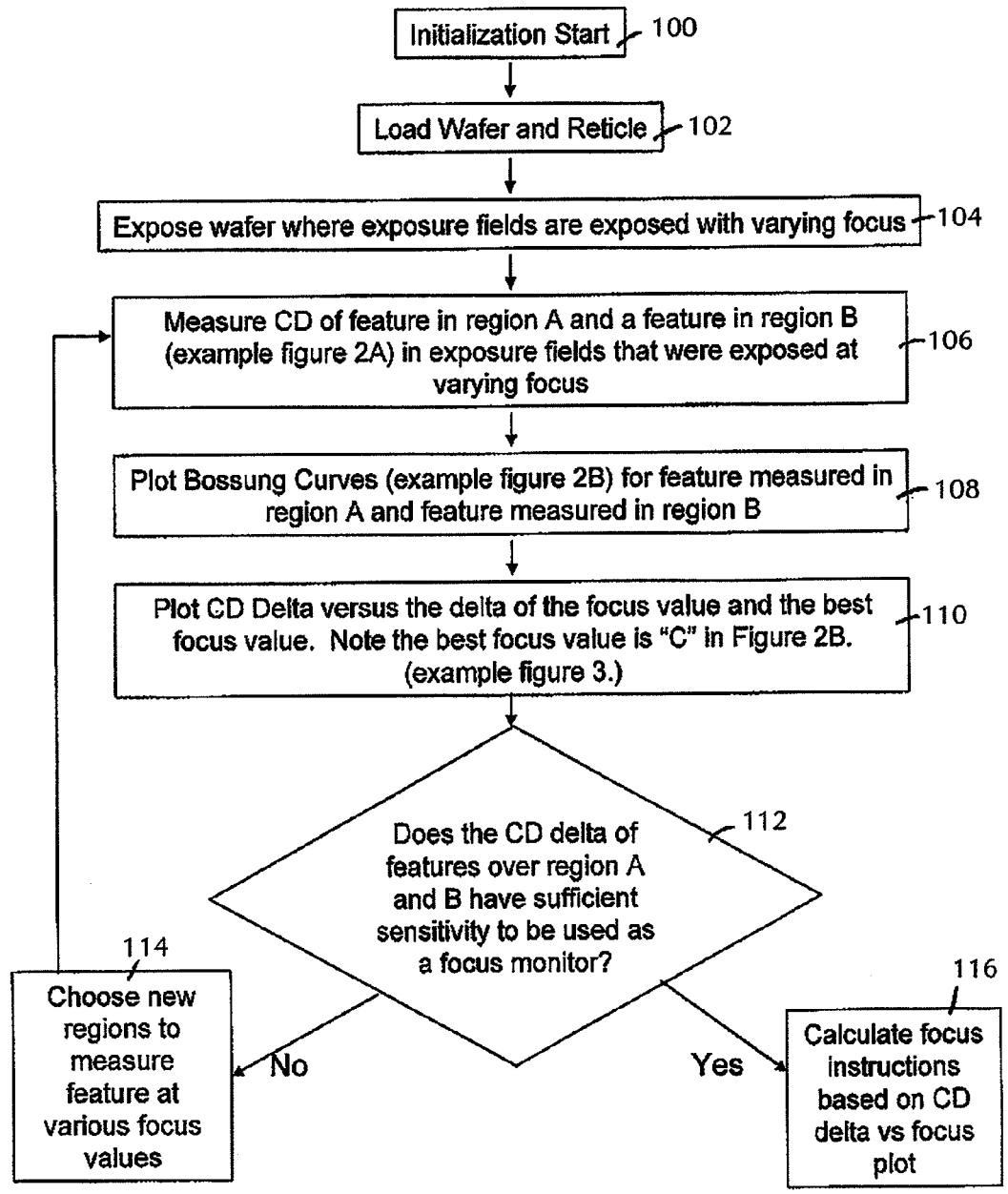
FIG. 6 shows a flowsheet of a method and apparatus of the invention to determine the focus value and a correlation between the critical dimensions of features A and B versus focus within an exposure field of a wafer.

Referring first to FIG. 6, the method and apparatus of the invention may be as described. After initialization start at step 100, the wafer and reticle are loaded into the scanning apparatus at step 102. The reticle is exposed over the wafer to create different exposure fields using the same dose but a varying focus for each exposure field to determine the critical dimension versus focus parameters in Step 104. The critical dimensions of two different features in two different regions, e.g., feature A in region A and feature B in region B, in each exposure field is measured in Step 106. It should be noted that these two regions are ideally not randomly chosen. The preferred embodiment would be the situation where the lithographer has some knowledge of the local topography expected. Also, with a scanner, it is preferable to select the regions so that they are simultaneously at different positions in the "slit" but at very similar positions in the scan. Specifically, the two regions should be geometrically positioned within the exposure field so that the exposure tool cannot expose both of them at best focus. Step 108 plots Bossung curves for feature A and feature B. Step 110 plots delta (change in) critical dimension (CD) for feature A minus CD for feature B versus the delta of the focus value. Step 112 determines if the CD delta has sufficient sensitivity to be used as a focus monitor. If no, Step 114 chooses new features to measure. If yes, Step 116 calculates the focus instruction values based on the Bossung curve and the CD delta versus focus plot delta. Referring to FIG. 3, which is a plot of CD delta versus focus value delta, sensitivity may be defined as the curve having a positive or negative slope, with the greater the slope, the greater the sensitivity. The user may determine the desired minimum slope needed for the plot to be used as a focus monitor.

Figure 7:
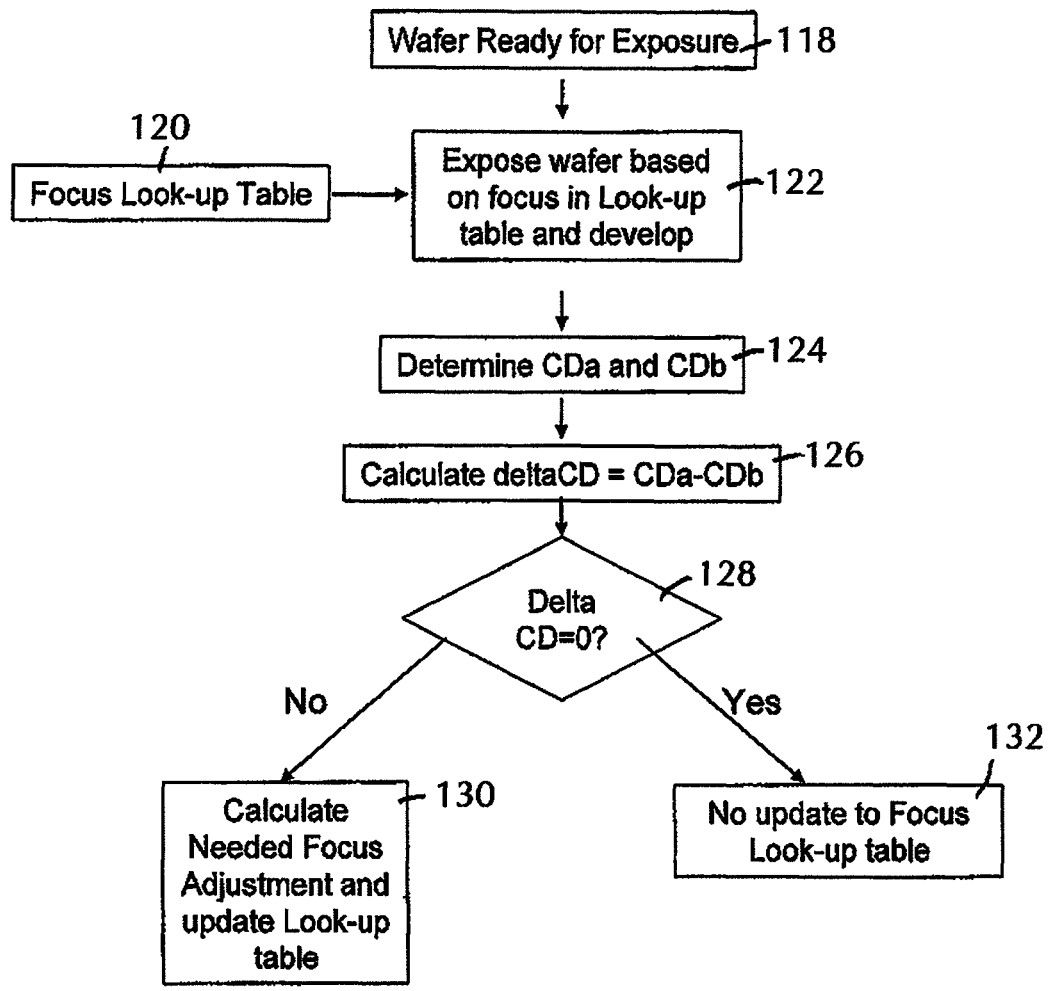
FIG. 7 shows a flowsheet of a method and apparatus of the invention to expose a wafer.

Referring now to FIG. 7, focus instruction values have been determined for the wafer and the system is ready to expose a new image wafer in Step 118. Step 122 starts the scan and the new wafer is exposed with varying focus instruction values in different exposure fields as described in connection with FIG. 6, based on the previous focus instruction value look up table 120. The focus instruction value look up table contains the focus information obtained from the Bossung plots and initial delta CD v. delta focus value plot of FIG. 3. $CD_A$ and $CD_B$ are determined in Step 124. $\Delta CD$ is calculated in Step 126 as the difference between $CD_A$ and $CD_B$. Step 128 determines if any change has occurred from the initial $\Delta CD$ v. $\Delta$focus value plot as a result of exposure tool focus drift. If a change has occurred, the needed focus correction is calculated and the look up table is updated in Step 130 for subsequent wafers. If no correction is needed, in Step 132 the previous look up table is used for subsequent wafers that will be exposed.

Figure 8:
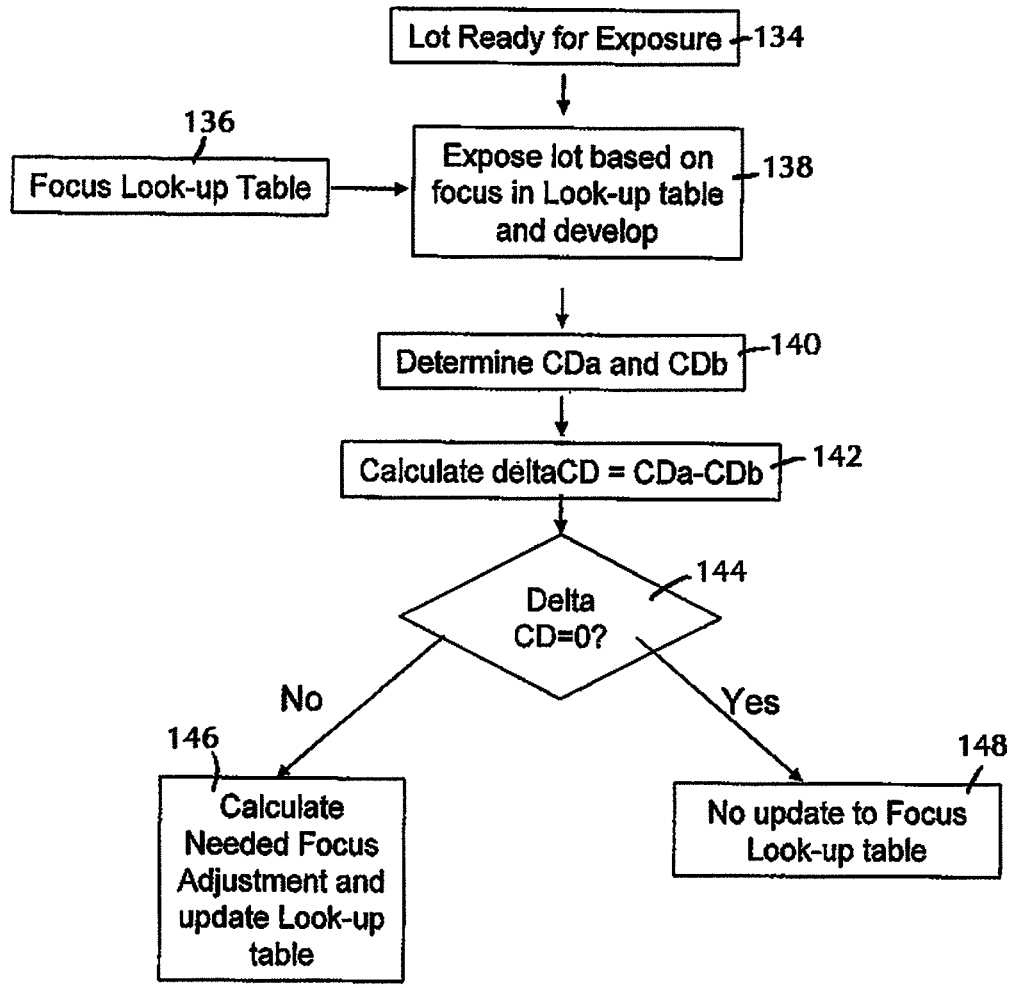
FIG. 8 shows a flowsheet of a method and apparatus of the invention to determine if any focus correction is needed to the original focus value determined in FIG. 6 because of operational variances occurring during the processing of multiple wafers and lots in the semiconductor manufacturing process.

Referring now to FIG. 8, a lot of wafers (more than one) are ready for exposure in Step 134. The lot is exposed in Step 138 based on the focus instruction value look up table in Step 136. After a desired number of lots are processed using the initial plot of $\Delta CD$ v. $\Delta$focus value (FIG. 3), the first wafer of a subsequent lot is again exposed at different focus values. $CD_A$ and $CD_B$ are again determined in Step 140 and $\Delta CD$ v. $\Delta$focus value is calculated in Step 142 to determine if exposure tool focus drift has occurred. $\Delta CD$ is checked in Step 144 to determine if any change has occurred from the initial $\Delta CD$ v. $\Delta$focus value plot. If no (signifying a change from the previous $\Delta CD$ v. $\Delta$focus value plot), the previous look up table is updated and the focus for the next lot is adjusted in Step 146. If yes, there is no need to update the previous focus instruction value look up table in Step 148.

It should be noted that the processes illustrated in FIG. 7 and FIG. 8 have advantages and disadvantages with respect to each other. The method of FIG. 7, gives immediate focus feedback to the next wafer exposed. Thus, if the exposure tool had drifted since the last exposure only the first wafer will be exposed "out of focus" (assuming the exposure tool was in new steady state). Even if the focus is drifting through the exposure of the lot feedback to the next wafer can be given using the method of FIG. 7. However, the quick focus correction requires fast CD metrology. While this is possible, the method of FIG. 8 illustrates the more commonly expected method to be used by performing metrology monitoring after all the wafers of a lot are exposed. As mentioned about, in the flow illustrated in FIG. 8 the focus correction would be applied to the next lot that is exposed.

Figure 1:
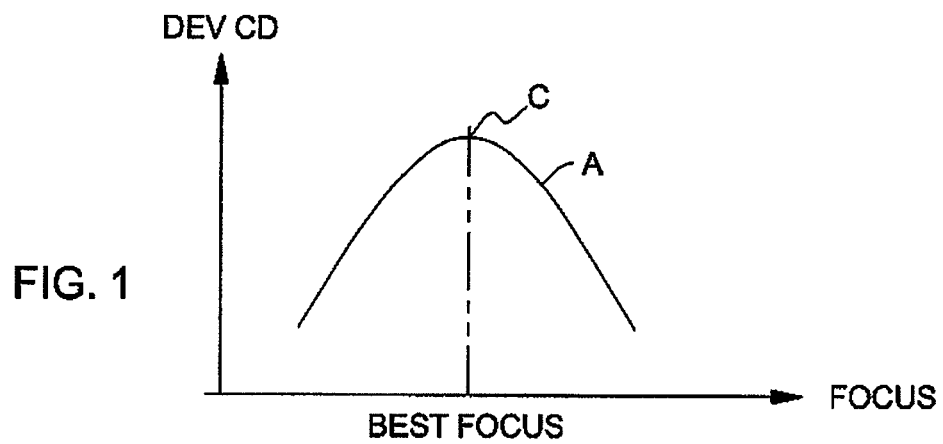
FIG. 1 illustrates a typical Bossung plot of focus vs. critical dimension for feature A in region A on a wafer.

Referring now to FIG. 1, a typical Bossung curve of critical dimension vs. focus is shown. In this figure, curve A shows the typical polynomial curve formed when the critical dimension is measured at different levels of negative and positive focus. The best focus is shown at point C and this focus would typically be used when imaging the chip on the wafer. The critical dimension varies by focus and is termed $CD_A$ over the length of the curve. $CD_A$ is at its preferred value at best focus C.

Figure 2A:
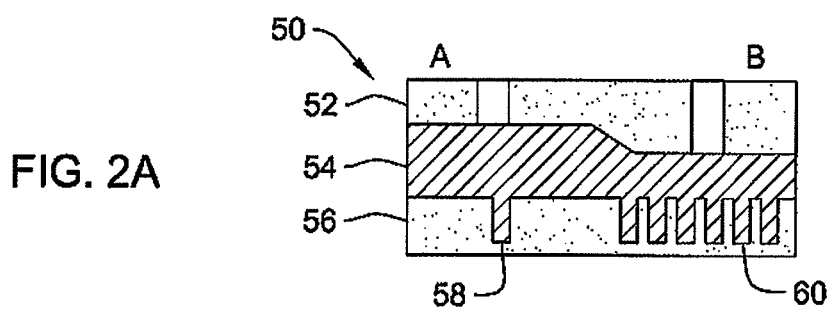
FIG. 2A illustrates a portion of a wafer having a region A, with an isolated via and a region B, with nested vias.
Figure 2B:
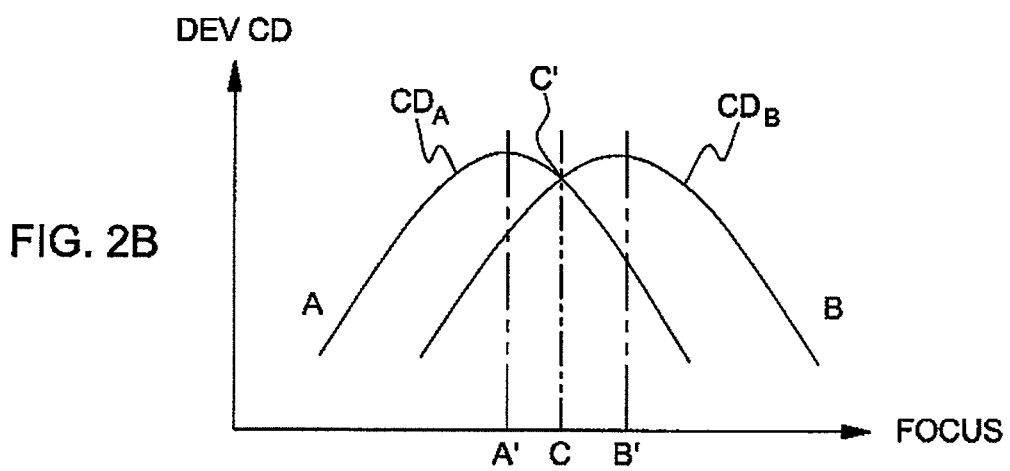
FIG. 2B is a Bossung plot of feature A imaged over region A (curve A) and a feature B imaged over region B (curve B).

FIG. 2A shows a typical portion of a wafer 50 showing an imaging (photoresist layer) layer 52, an under layer 54 and a patterned substrate layer 56. In the patterned substrate layer is shown an isolated via 58 (Area A) and a dense via area 60 (Area B). When such a wafer has fields exposed at varying focus, Bossung curves A and B can be formed and plotted as shown in FIG. 2B. As can be seen the best focus for curve A is A' and the best focus position for curve B is B'. The value of CD for curve A ($CD_A$) varies over the range of focus as does to value of CD for curve B ($CD_B$) over the range of focus value.

In the method of the invention, curves A and B are correlated and their intersection point C determines the best focus within an exposure field on the wafer. This is the method of one aspect of the invention. As can be seen the value for $CD_A$ and $CD_B$ are equal at the intersection point C' and this is the best focus C. For some applications it may be desirable to set the focus value so that the difference between $CD_A$ and $CD_B$ is not zero. The difference may vary depending on manufacturing specifications and may vary up to ±10% of the calculated best focus value, or higher, or up to ±200 nm or greater of the calculated best focus value.

Referring to FIG. 3 a plot of focus shift versus the difference between $CD_A$ and $CD_B$ is shown. Thus, if $CD_B$ is greater than $CD_A$, a negative value is obtained showing a positive focus shift. In this case, it is necessary to decrease the focus by the appropriate value to return to a zero focus shift resulting in a return to the original focus value C. If $CD_A$ equals $CD_B$ this shows that there was no operational variances and no correction to the focus is required.

FIG. 3 is generated by plotting the difference between $CD_A$ and $CD_B$ versus focus shift using the data of the respective Bossung curves A and B—as shown for example in FIG. 2B. FIG. 3 is used as a look-up table to adjust the focus based on this difference. Thus, if $CD_A$ and $CD_B$ are equal this shows that there was no focus shift and no focus correction is required. A correction will be required if $CD_A$ differs from $CD_B$. This is an important feature of the invention since a relatively simple and fast measurement of $CD_A$ and $CD_B$ can be performed and the adjustment calculated.

Figure 4A:
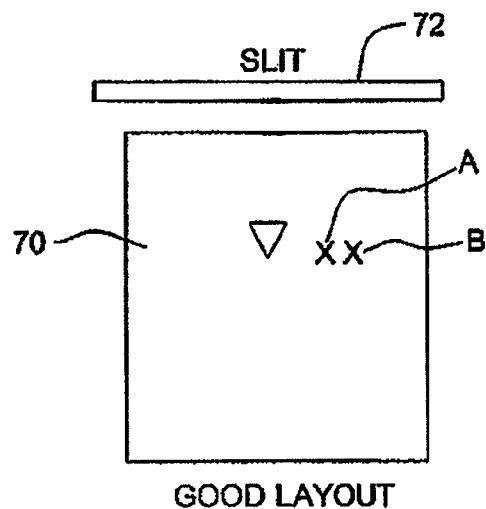
FIGS. 4A and 4B show a scanning slit moving over a reticle wherein the scanned features A and B of the reticle are in the same scan line in FIG. 4A and in a different scan line in FIG. 4B.
Figure 4B:
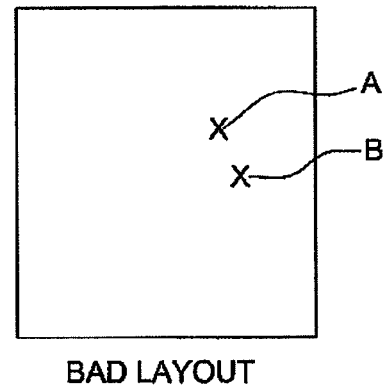
Figure 5:
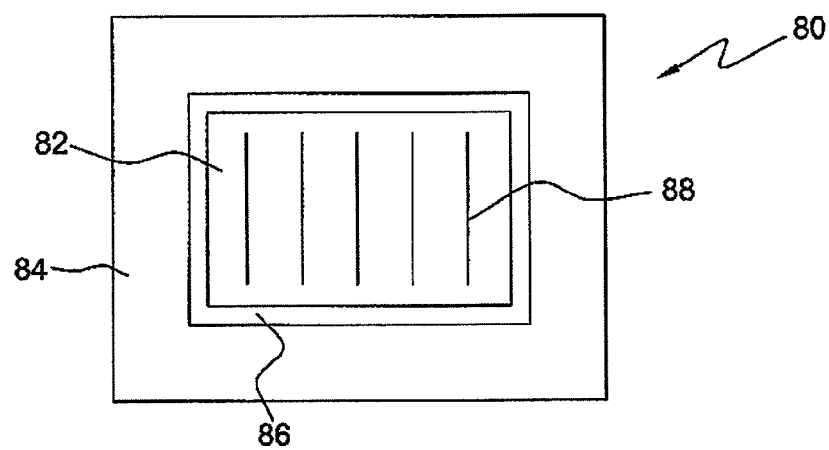
FIG. 5 illustrates a conventional prior art reticle used in semiconductor wafer fabrication.

FIG. 4A shows a chip 70 and scanning slit 72. Features A and B of the chip are shown adjacent to each other and are along the direction of the slit, where they would be simultaneously measured, to avoid a different focus compensation. This is to be contrasted with features A and B as shown in FIG. 4B which are not along the slit direction and would not be simultaneously measured and would not provide an accurate measure of the focus offset needed to provide optimum focus for the scan.

Thus, the present invention achieves the objects set forth above. The present invention provides an improved method and apparatus for determining the best focus to expose a wafer with and for monitoring focus of the wafer during the photolithographic process, particularly for step-and-scan system.

While the present invention has been particularly described, in conjunction with a specific preferred embodiment, it is evident that many alternatives, modifications, and variations will be apparent to those skilled in the art in light of the foregoing description. It is therefore contemplated that the appended claims will embrace any such alternatives, modifications, and variations as falling within the true scope and spirit of the present invention.

Thus, having described the invention, what is claimed is:

1. A method of monitoring focus during photolithography on a wafer comprising the steps of:
    loading a wafer and a patterned reticle into a step-and-scan wafer imaging photolithography exposure system;
    exposing the reticle using the step-and-scan system using a same dose but a varying focus for each exposure field of the reticle pattern on the wafer;
    measuring the critical dimensions of two different features in two different regions in each exposure field, the features and regions being the same in each exposure field, the two different regions being positioned in each exposure field so that the step-and-scan wafer imaging photolithography exposure system cannot expose both of them at best focus;
    plotting Bossung curves of critical dimension versus focus for the two different features in the two different regions;
    determining a first best focus for the first of the two different features and a second best focus for the second of the two different features;
    correlating the first and second best focuses with each other to determine their intersection point which comprises a best focus of the exposure field;
    plotting the critical dimension difference between the Bossung curves for the two different features in the two different regions versus focus shift using data from the Bossung curves of the two different features and the best focus of the exposure field to obtain a sloped plot;
    determining if the difference plot has sufficient sensitivity to be used as a focus monitor by determining whether the sloped plot has a desired minimum slope needed for the sloped plot to be used as the focus monitor, and if the sloped plot does not have the desired minimum slope to meet sufficient sensitivity, choosing new features in two different regions and repeating the measuring, best focus determination, correlating and plotting steps until sufficient sensitivity for use as a focus monitor is achieved;
    determining focus instruction values based on the difference plot focus monitor;
    scanning and exposing a new wafer based on the determined focus instruction values.

2. The method of claim 1 further including determining if the exposure system focus instruction value has drifted by exposing a new wafer to create exposure fields at a different focus based on the focus instruction values, again measuring critical dimension of a feature in two different regions in each exposure field to create new Bossung curves, plotting the difference between the new Bossung curves, determining if the difference between the new Bossung curves has changed compared to the difference between the previous Bossung curves, and adjusting if necessary the focus instruction values based on the difference between the new Bossung curves.

3. The method of claim 2 wherein a correlation is made between the difference between the critical dimension for each feature versus focus shift and the focus instruction values based on the correlation are adjusted.

4. The method of claim 3 wherein, for a first feature A in a first region on an exposure field and for a second feature B in a second region on the exposure field, if the critical dimension for feature B is less than the critical dimension of feature A the focus instruction value is increased.

5. The method of claim 3 wherein, for a first feature A in a first region on an exposure field and for a second feature B in a second region on the exposure field, if the critical dimension for feature B is greater than the critical dimension for feature A the focus instruction value is decreased.

6. The method of claim 1 wherein the determined focus instruction value may vary up to ±10%.

7. The method of claim 1 wherein the determined focus instruction value may vary up to ±200nm.

8. The method of claim 1 wherein the desired minimum slope comprises a predetermined desired minimum slope defined by an end-user.

9. The method of claim 1 wherein the sensitivity is defined as the sloped plot having a positive or negative slope, whereby the greater the slope, the greater the sensitivity.

10. The method of claim 1 further including storing the difference plot data in a look-up table.

11. The method of claim 10 further including determining if the exposure system focus instruction value has drifted by exposing a new wafer based on the focus instruction values to create exposure fields at a different focus, again measuring critical dimension of a feature in two different regions in each exposure field to create new Bossung curves, plotting the difference between the new Bossung curves, and using the look-up table determining if the difference between the new Bossung curves has changed compared to the difference between the previous Bossung curves stored in the look-up table, and adjusting if necessary the focus instruction values based on the difference between the new Bossung curve.

12. The method of claim 10 further including determining if the exposure system focus instruction value has drifted by exposing a lot of wafers based on the focus instruction values to create exposure fields at a different focus, again measuring critical dimension of a feature in two different regions in each exposure field to create new Bossung curves, plotting the difference between the new Bossung curves, and using the look-up table determining if the difference between the new Bossung curves has changed compared to the difference between the previous Bossung curves stored in the look-up table, and adjusting if necessary the focus instruction values based on the difference between the new Bossung curve.

13. The method of claim 1 wherein the best focus of the exposure field is monitored and maintained in a feedback loop during the exposure process so that each wafer receives the best focus process conditions known based on recently exposed wafers.

14. An apparatus for making an integrated circuit device comprising a wafer wherein photolithography means are used to image the wafer during the making of the integrated circuit device comprising:
    a loading apparatus for loading a wafer and a patterned reticle into a step-and-scan wafer imaging photolithography exposure system; the photolithography exposure system including an exposure apparatus to expose the reticle using a same dose but a varying focus exposure field for each reticle pattern on the wafer;
    a measuring apparatus to measure the critical dimension of a feature in two different regions in each exposure field, the features and regions being the same in each exposure field, the two different regions being positioned in each exposure field so that the step-and-scan wafer imaging photolithography exposure system cannot expose both of them at best focus;
    a plotting apparatus to plot a Bossung curve of critical dimension versus focus for the two different features in the two different regions;
    a best focus determining and correlating apparatus to determine a best focus for each of the two different features, and to correlate these best focuses of the two different features with each other to determine their intersection point which comprises a best focus of the exposure field;

a plotting apparatus for plotting the critical dimension difference between the critical dimension for the two different features in the two different regions regions versus focus shift using data from the Bossung curves of the two different features and the best focus of the exposure field to obtain a sloped plot;

a difference plot sensitivity apparatus for determining if the difference plot has sufficient sensitivity to be used as a focus monitor by determining whether the sloped plot has a desired minimum slope needed for the sloped plot to be used as the focus monitor, and if the sloped plot does not have the desired minimum slope to meet sufficient sensitivity, choosing new features in two different regions and repeating the measuring, best focus determination, correlating and plotting steps until sufficient sensitivity for use as a focus monitor is achieved;

a focus determination apparatus to determine a focus instruction value for the exposure fields based on the above plots;

a scanning and imaging apparatus for scanning and imaging the wafer based on the determined focus instruction value; and a release apparatus for releasing the wafer and unloading the wafer from the exposure system.

15. The apparatus of claim 14 wherein the focus determination apparatus varies the determined focus instruction value up to ±200 nm.

16. The apparatus of claim 14 which is used to monitor the focus of each scan during use of the apparatus to scan multiple wafers further comprising:

an exposing apparatus to expose a new wafer to create exposure fields at different focus based on the focus instruction values;

a measuring apparatus to measure the critical dimension for feature A and feature B;

a calculating apparatus to calculate the difference between the critical dimension of a feature in each exposure field to create new Bossung curves;

a plotting apparatus to plot the difference between the new Bossung curves;

a determining apparatus to determine if the difference between the new Bossung curves has changed compared to the difference between the previous Bossung curves;

an adjusting apparatus to adjust the focus instruction value if necessary based on the difference;

a scanning and exposing apparatus to scan and expose the next wafer based on the adjusted focus instruction values; and continuing the above steps until the scanning and exposing of each wafer is completed.

17. The apparatus of claim 16 wherein a correlation apparatus is used to form a correlation between the difference between the critical dimension for each feature of the scan position versus focus shift and adjusting the focus instruction value based on the correlation.

18. The apparatus of claim 17 wherein the focus adjustment apparatus varies the determined focus instruction value up to ±200 nm.

19. The apparatus of claim 16 wherein the adjustment apparatus increases the focus instruction value if the critical dimension for feature B is less than the critical dimension for feature A.

20. The apparatus of claim 8 wherein the adjustment apparatus decreases the focus instruction value if the critical dimension for feature B is greater than the critical dimension of feature A.

21. A method of monitoring focus during photolithography on a wafer comprising the steps of:

loading a wafer and a patterned reticle into a photolithography exposure system;

using the photolithography exposure system exposing the various exposure fields across the reticle pattern at a best focus of the photolithography exposure system;

measuring critical dimensions of two different features in two different regions in each exposure field;

plotting Bossung curves of critical dimension versus focus for the two different features in the two different regions;

providing a best focus of the exposure field by determining best focus for each of the two different features followed by correlating these best focuses to obtain their intersection point which comprises the best focus of the exposure field;

plotting a difference plot of the critical dimension difference between the Bossung curves versus focus shift of the best focus of the exposure field to obtain a sloped plot; and determining whether the sloped plot has a desired minimum slope of the sloped plot which indicates that the best focus of the exposure field has sufficient sensitivity to be used as a focus monitor, and if not, choosing new features in two different regions and repeating the measuring, best focus determination, correlating and plotting steps until sufficient sensitivity for use as a focus monitor is achieved.

* * * * *